United States Patent [19]

Schroeder

[11] 4,352,208
[45] Sep. 28, 1982

[54] AUTOMATIC IF SELECTIVITY FOR RADIO RECEIVER SYSTEM

[75] Inventor: Daniel R. Schroeder, Glen Ellyn, Ill.

[73] Assignee: Motorola, Inc., Schaumburg, Ill.

[21] Appl. No.: 256,760

[22] Filed: Apr. 23, 1981

Related U.S. Application Data

[63] Continuation-in-part of Ser. No. 127,006, Mar. 4, 1980, abandoned.

[51] Int. Cl.³ .......................... H03J 3/08; H04B 1/16
[52] U.S. Cl. .................................... 455/266; 455/168
[58] Field of Search ............... 455/266, 161, 165, 167, 455/168, 176, 177, 173, 180, 182, 183, 185, 188; 358/191, 193.1; 334/18, 87

[56] References Cited

U.S. PATENT DOCUMENTS

| | | | |
|---|---|---|---|
| 3,872,387 | 3/1975 | Banach | 455/266 |
| 3,890,951 | 8/1976 | Breeze | 455/180 |
| 3,904,968 | 9/1975 | Brinegar . | |
| 3,909,735 | 9/1975 | Anderson | 455/266 |
| 3,944,932 | 3/1976 | Fong . | |
| 3,991,374 | 11/1976 | Cssissatla . | |
| 4,030,036 | 6/1977 | Kusano . | |
| 4,038,689 | 7/1977 | Rzeszewski | 455/183 |
| 4,045,740 | 8/1977 | Baker | 455/266 |
| 4,124,817 | 11/1978 | Takahashi . | |
| 4,135,158 | 11/1979 | Parmet . | |
| 4,259,740 | 3/1981 | Snell | 455/266 |

FOREIGN PATENT DOCUMENTS

| | | | |
|---|---|---|---|
| 5245814 | 10/1975 | Japan | 455/183 |
| 2001813 | 2/1979 | United Kingdom | 455/168 |

OTHER PUBLICATIONS

Digital Television Tuner Uses MOS LSI and Nonvolatile Memory, by Penner, Electronics, Apr. 1, 1976, pp. 86–90.

Voltage Synthesized Electronic Tuning System LSI for AM/FM Radio, by Ikeguchi, IEEE Transactions on Consumer Electronics, vol. CE-25, Aug. 1979, pp. 621–626.

Technics ST-9030 Tuner, Audio Magazine, Jul. 1979.

National Semiconductor Combined Engineering and Application Note for Part No. DS8907 AM/FM Digital Phase-Locked Loop Frequency Synthesizer.

*Primary Examiner*—Tommy P. Chin
*Attorney, Agent, or Firm*—James S. Pristelski; James W. Gillman

[57] ABSTRACT

A microprocessor controlled radio receiver system for switching bandwidths of an intermediate frequency stage from a normally scanning mode using a relatively narrow bandwidth to a second mode using a relatively wide bandwidth automatically when there are no interfering signals from adjacent channels of a channel or station selected for receiving. Upon selection of a channel for listening the microprocessor controlled synthesizer causes the synthesizer to scan up one adjacent channel and down one adjacent channel to determine if there is an interfering signal therefrom and then returns to the selected channel. In the event of no interfering signal from an adjacent channel, switching is effected in the IF stage from a narrow bandwidth to a wide bandwidth to improve the quality of reception. If there is an adjacent channel signal detected of sufficient IF energy next to the selected channel, then the narrow bandwidth mode used during the scan will be maintained.

4 Claims, 2 Drawing Figures

AUTOMATIC IF SELECTIVITY FOR RADIO RECEIVER SYSTEM

CROSS-REFERENCE TO RELATED APPLICATION

This application is a continuation-in-part patent application of a co-pending U.S. patent application Ser. No. 127,006, filed on Mar. 4, 1980, now abandoned.

BACKGROUND OF THE INVENTION

This invention relates to radio receivers having dual bandwidth intermediate frequency (IF) stages and, more particularly, to a bandwidth switching system to provide improved IF bandpass selectivity.

It is well known that there are radio broadcast receivers which offer switchable IF selectivity. In such prior art receivers, typically an interference-free radio signal condition is obtained with a narrow band-pass IF filter and higher fidelity is obtained with a wide bandpass IF filter. However, the existing systems have not been altogether satisfactory in providing better audio quality, especially when listening to a relatively weak station or channel which is located adjacent to a relatively strong station or channel. Furthermore, in many prior art IF selectivity arrangements, the choice of IF selectivity is usually dependent upon the signal characteristics of the selected channel and not upon adjacent channel characteristics or interference.

SUMMARY OF THE INVENTION

It is therefore the principal object of this invention to improve IF bandpass selectivity in radio receivers depending upon reception conditions and adjacent channel conditions.

It is another object of the present invention to enable automatically switching the bandwidth of the intermediate frequency filter from a relatively narrow bandwidth to a relatively wider bandwidth.

It is still another object of the present invention to provide for a microprocessor controlled synthesized radio receiver capable of operating in different modes of operation to effect different IF bandpass selectivities.

It is still a further object of the present invention to improve upon the design of radio receivers and to simplify their construction while still enabling many functions and multiple modes of operation to thereby effect less distortion and better audio quality from the receivers.

Briefly, the present invention is an improvement over the prior art systems in that it enables scanning of the broadcast band while using a relatively narrow bandwidth or higher selectivity and then automatically switches to a relatively wider bandwidth or lower selectivity upon stopping at a channel selected during scan after it has been determined that there is no interference from an adjacent channel signal. Basically, the bandwidth switching system for the radio receiver includes means for scanning predetermined broadcast channels, means for receiving signals from the scanning means and providing predetermined IF bandwidths in response thereto, the signal receiving means being further characterized by having a first mode of operation with a first bandwidth and a second mode of operation with a second bandwidth, detector means for receiving the predetermined IF bandwidth signals from the signal receiving means and converting the IF signals into audio signals, station detecting means coupled to an input of said detector means for detecting the presence of a signal of sufficient strength within the predetermined IF bandwidth and for supplying an output to said scanning means if such signal is present so as to enable said scanning means to operate to scan up and down at least one adjacent channel spacing, and controlling means for controlling the mode of operation of said signal receiving means in response to signals from said station detecting means whereby either said first mode of operation or said second mode of operation is selected depending upon whether an adjacent channel is detected. The scanning means preferably includes a phase locked loop frequency synthesizer coupled to a microprocessor. Typically, the first mode of operation uses a narrow filter and the second mode of operation uses a wide filter. A narrow filter is preferably used during scanning of the predetermined broadcast channels.

DESCRIPTION OF THE PREFERRED EMBODIMENT

Figure 1:
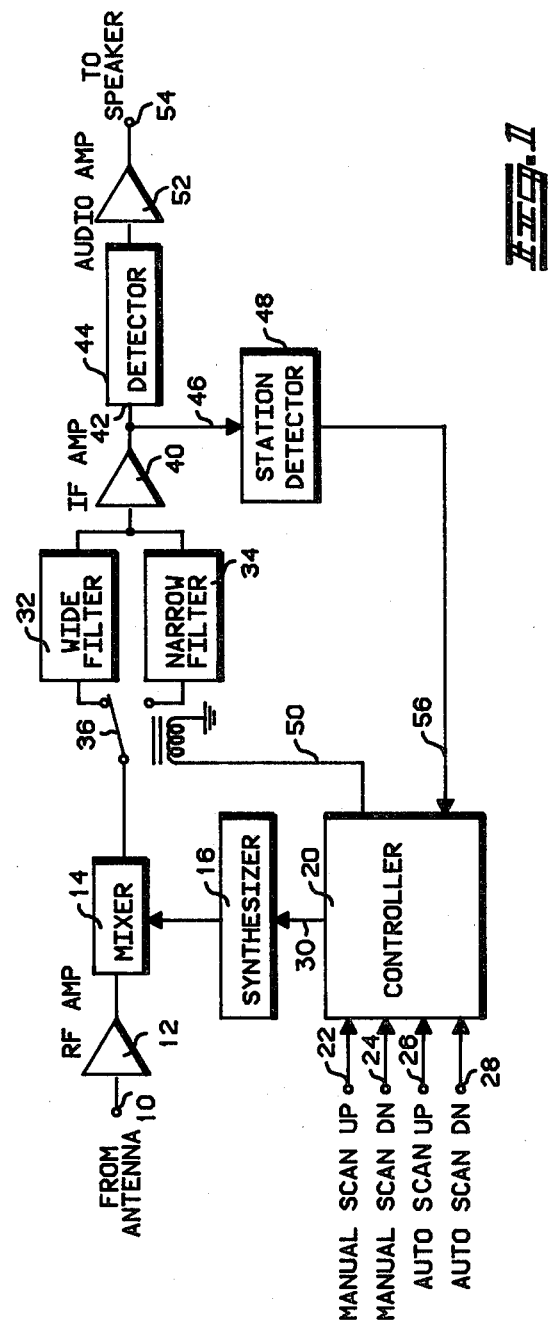
FIG. 1 illustrates in block diagram form a radio receiver having the bandwidth switching system of the present invention.

With reference to FIG. 1, there is shown portions of a typical radio receiver including an antenna 10, and a radio frequency (RF) amplifier stage 12 which provides amplified input RF signals to a mixer 14. Also providing an input to mixer 14 is a synthesizer 16 which is controlled by a microprocessor controller 20 capable of operating in the manual scan up, manual scan down, auto scan up, and auto scan down modes of operation in response to user initiated inputs at input lines 22, 24, 26 and 28, respectively. The RF signal associated with the selected channel or station is converted to an IF signal by mixer 14, the output of which is then routed via a switch 36 to one of a pair of bandpass filters 32 or 34.

In accordance with one of the aspects of the instant invention, the IF selectivity is switchable to provide either narrow or wide bandwidth. This is accomplished by using a wide bandwidth filter 32 and a narrow bandwidth filter 34 together with switch 36. Switch 36 is depicted as an electromagnetic type of switch, for example, a relay, for simplicity in illustrating the invention. It will be realized by those skilled in the art that other types of electronic switches may also be satisfactorily utilized.

The output from filter 32 or filter 34 is supplied to an IF amplifier 40 which provides an amplified IF signal at an input 42 of an audio detector 44 and to a line 46 to a station detector 48. Audio detector 44 supplies the detected audio signal to an audio amplifier 52 which in turn supplies an amplified audio signal on a line 54 to a speaker (not shown).

Station detector 48 senses sufficient energy within the IF band in any suitable manner known to those skilled in the art. When there is sufficient energy within the IF band, which is indicative of reception of a station on the selected channel or frequency, a signal is supplied by station detector 48 on a line 56 to the microprocessor controller 20. For example, if a station is detected, the output on line 56 may be in a high logic state and when no station is detected, the output on line 56 may be in a low logic state.

Due to the relatively uncomplicated tasks which microprocessor controller 20 is required to execute, virtually any current available microprocessor can be used. The amount of memory space required is minimal. Preferred microprocessor types are part number TMS1000 which is commercially available from Texas Instruments, part number MC141000 which is commercially available from Motorola, Inc., or part number MM57170 which is commercially available from National Semiconductor.

Synthesizer 16 may be any one of a wide variety of commercially available integrated circuits. One preferred example is part number DS8907 for an AM/FM digital phase-locked loop frequency synthesizer available from National Semiconductor. A six page combined specification sheet and application note dated January 1980 is also available from National Semiconductor for this part number. For example, in the present invention, line 30 in FIG. 1 illustrates, collectively, separate lines for 50 Hz, 500 KHz, clock data and enable signals between synthesizer 16 and microprocessor controller 20. Data to update synthesizer 16 when controller 20 wishes to change channels is serially encoded on the single data line.

As previously mentioned, microprocessor controller 20 has a plurality of user initiated inputs for controlling channel or station selection. The manual scan up and manual scan down inputs at lines 22 and 24, respectively, are considered optional under the present invention. Basically, these inputs provide the capability of manually incrementing or decrementing to the next adjacent channel or station whether or not that channel or station is actually used. This permits the user to manually tune the radio receiver. Of course, these inputs could also be used to increment fractions of an adjacent channel step to provide the radio user with a fine tuning feature to further minimize distortion or interference from a strong adjacent station.

Figure 2:
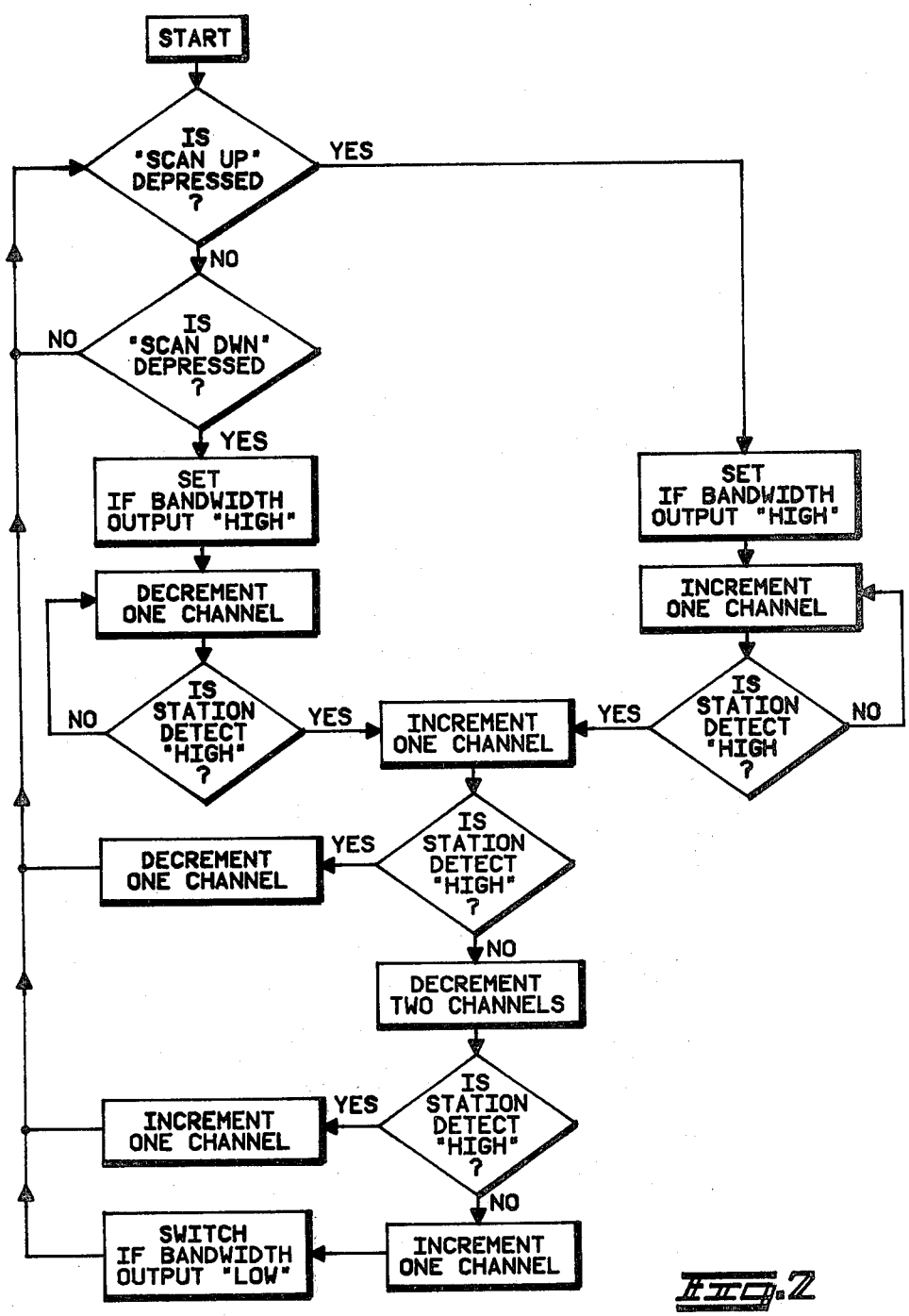
FIG. 2 is a flow diagram illustrating the steps which the controller 20 in FIG. 1 executes in response to signal conditions in the bandwidth switching system.

In accordance with another aspect of the present invention, there are provided auto scan up and auto scan down inputs on lines 26 and 28, respectively, to the microprocessor controller 20. With reference to FIG. 2, there is illustrated a flowchart for the microprocessor controller 20 when either of the auto scan inputs at lines 26 or 28 are initiated. If the auto scan up input 26 is initiated, the microprocessor controller 20 sets the IF bandwidth output on line 50 in a high logic state condition. This causes the electromagnetic winding of switch 36 to be energized thereby causing switch 36 to change from the state shown in FIG. 1 to provide IF signals from mixer 14 to the narrow filter 34. At the same time, microprocessor controller 20 sends information on line 30 to synthesizer 16 to cause synthesizer 16 to increment by one channel spacing by changing its output to mixer 14. As long as station detector 48 continues to remain in a low state indicative of no station present, microprocessor controller 20 continues to increment channel by channel. As soon as a station is detected by station detector 48, the output on line 56 goes high and the microprocessor controller increments an additional channel. At this point, an adjacent channel to the desired channel is being tested to determine whether it also contains a broadcasting station which results in an IF signal of predetermined magnitude. If so, microprocessor controller 20 decrements one channel and leaves switch 36 in the energized position thereby utilizing the narrow filter IF bandwidth because of the presence of the adjacent station. If sampling of the adjacent channel indicates that there is no adjacent channel on the upper side of the desired channel because station detector output on line 56 remains in a low logic state, then microprocessor controller 20 decrements two channels to determine if there is a station in the channel on the lower adjacent channel side of the desired station. If so, microprocessor controller 20 increments one channel to get back to the desired station and keeps switch 36 energized so as to utilize the narrow filter capability of the IF stage. If no station is detected on the lower channel side of the desired station, microprocessor controller 20 increments one channel to get back to the desired station and switches its IF bandwidth output on line 50 to a low logic state thereby de-energizing switch 36 so that switch 36 is now in the condition shown in FIG. 1 to use the wide filter IF bandwidth capability since no stations were detected in either of the upper or lower adjacent channels.

The operation in the auto scan down mode is similar except that initially channels are decremented, rather than incremented, until a station is detected which results in the output of station detector 48 on line 56 assuming a high logic level. At this point, microprocessor 20 begins the same procedure, as in the auto scan up mode, of checking the adjacent channels to determine if any stations are present therein. If there are any stations broadcasting in the adjacent channels, microprocessor controller 20 returns to the desired station and keeps switch 36 energized to use the narrow filter capability of the IF stage. If checking the adjacent channels indicates that no stations are present therein, microprocessor controller 20 de-energizes switch 36 by setting its IF bandwidth output on line 50 to a low logic state such that the wide filter capability of the IF stage is utilized.

It will now be appreciated that, by virtue of the above-described invention, it is possible to automatically switch from one bandwidth to a second bandwidth, which is relatively wider than the first bandwidth, in the intermediate frequency stage of a radio receiver when no potentially interferring signals are present in adjacent channels, thereby providing better audio and listening quality to the user.

While an embodiment of the invention has been shown and described, it will be obvious to those skilled in the art that changes and modifications may be made without departing from the invention in its broader aspects, and, therefore, the aim of the appended claims is to cover all such changes and modifications as fall within the true spirit and scope of the invention.

I claim:

1. In a bandwidth switching system for a radio receiver capable of switching the bandwidth of an intermediate frequency stage of the receiver from a first bandwidth to a second bandwidth automatically, the improvement comprising:
   means for scanning predetermined broadcast channels,
   means for receiving signals from said scanning means and providing predetermined IF bandwidths in response thereto;
   said signal receiving means being further characterized by having a first mode of operation with a first bandwidth and a second mode of operation with a second bandwidth;

detector means for receiving the predetermined IF bandwidth signals from the signal receiving means and converting the signals into audio signals, station detector means coupled to an output of said signal receiving means for detecting the presence of a predetermined channel having a signal of sufficient strength within the predetermined IF bandwidth and for supplying an output signal to said scanning means if such signal is present so as to enable said scanning means to operate to scan up and down at least one adjacent channel spacing; and controlling means for controlling the mode of operation of said signal receiving means in response to signals received from said station detector means whereby either said first mode of operation or said second mode of operation is selected depending upon whether an adjacent channel of predetermined magnitude is detected and for controlling the scanning means to operate to respectively scan down or up at least one adjacent channel spacing back to said predetermined channel.

2. The bandwidth switching system as defined in claim 1 wherein said scanning means includes a synthesizer coupled to a microprocessor controller within said controlling means.

3. The bandwidth switching system as defined in claim 2 wherein said first mode of operation uses a narrow filter and said second mode of operation uses a wide filter.

4. The bandwidth switching system as defined in claim 3 wherein said first mode of operation is used during scanning of the predetermined broadcast channels.

* * * * *